(12) United States Patent
Mizumura

(10) Patent No.: US 6,464,525 B2
(45) Date of Patent: Oct. 15, 2002

(54) OVERTRAVEL PROTECTION FOR ZIF ELECTRICAL CONNECTOR

(75) Inventor: Akinori Mizumura, Yamato (JP)

(73) Assignee: Molex Incorporated, Lisle, IL (US)

( * ) Notice: Subject to any disclaimer, the term of this patent is extended or adjusted under 35 U.S.C. 154(b) by 53 days.

(21) Appl. No.: 09/790,954

(22) Filed: Feb. 22, 2001

(65) Prior Publication Data

US 2001/0018285 A1 Aug. 30, 2001

(30) Foreign Application Priority Data

Feb. 28, 2000 (JP) ........................................ 2000-051478

(51) Int. Cl.[7] ............................................. H01R 13/629
(52) U.S. Cl. ............................................................ 439/342
(58) Field of Search ................................ 439/342, 259–270

(56) References Cited

U.S. PATENT DOCUMENTS 6,071,140 A * 6/2000 McHugh et al. ............ 439/342
6,116,936 A * 9/2000 Pei ............................... 439/342
6,146,178 A * 11/2000 Walkup et al. ............... 439/342

* cited by examiner

Primary Examiner—Gary Paumen
(74) Attorney, Agent, or Firm—Robert J. Zeitler

(57) ABSTRACT

An electrical connector for a pin grid-array package includes a base housing having terminals arranged in the same grid pattern as the lead pins of the pin grid-array package and a cover mounted on the base housing for slidable movement relative to the base housing. The cover has through holes therein for receiving the lead pins of the pin grid-array package. The electrical connector includes an actuator for sliding the cover relative to the base housing between a first, pin-insertion position and a second, contact-engagement position. The electrical connector includes an overtravel preventor for limiting movement overtravel of the cover relative to the base housing. The overtravel preventor includes a recessed portion, and a protruded portion which is movably accommodated within the recessed portion over a range of motion having the first insertion position and the second engagement position as its end points. The invention may also include a guide mechanism for limiting lateral movement between the cover and the base housing.

20 Claims, 8 Drawing Sheets

OVERTRAVEL PROTECTION FOR ZIF ELECTRICAL CONNECTOR

FIELD OF THE INVENTION

The present invention relates generally to an electrical connector and, more particularly, to an electrical connector for connecting a zero force insertion ("ZIF") pin grid-array ("PGA") package to a circuit member.

BACKGROUND OF THE INVENTION

A typical pin grid array package includes a silicon chip, a package including conductive and non-conductive components and a plurality of pins in a grid array depending downward from a bottom surface of the package. Conventionally, zero insertion fore electrical connectors for PGA packages include a plate-like base housing having a plurality of terminals arranged in the same grid pattern as the lead pins of the PGA package and a plate-like cover member having a plurality of through holes in the same grid pattern as the lead pins of the pin grid-array package, thus permitting the lead pins to be inserted in the through holes. The plate-like cover member is slidably positioned on the upper surface of the base housing.

The base housing and cover are slidably interconnected so that the cover is driven in a plane parallel to the underlying base housing between a first position in which the lead pins of the PGA package can pass through the through holes of the cover to reach the terminals mounted in the underlying base housing without requiring any insertion force to be applied to the lead pins and a second position in which the lead pins of the PGA package contact the terminals.

A variety of terminal structures have been proposed as appropriate for use in such sockets. Some such terminals are configured such that their contact portions engage the lead pins of a PGA package upon movement of the cover of the socket. Conversely, some terminals are configured such that the lead pins of a PGA package are brought to the contact portions of terminals.

Essentially all of the terminals have contact portions located in the terminal-receiving cavities of the base housing of the socket, and most have straight pin-like solder tails extending from the bottom of the base housing of the socket. These pin-like solder tails are inserted into through holes of a printed circuit board on which the socket is mounted, and are soldered to the printed circuit board.

The base housing typically has some type of drive mechanism formed thereon for slidably moving the cover over the underlying base housing. In some sockets, a cam is rotatably attached to one lateral side or end of the base housing, and the cam is adapted to be rotated with an associated handle, thereby permitting the cam axle to push or pull the cover over the underlying base housing. The handle may be rotated from a horizontal position in which it is parallel to the base housing to a vertical position in which it is perpendicular to the base housing. Alternatively, rotatable eccentric cams having a generally vertical axis of rotation are well known.

The demand for ever smaller electronic devices has driven the demand for smaller components that make up the electronic devices. However, customers also desire increasing performance from these smaller devices. Thus, component designers must continue to shrink their designs while still improving their performance and ease of use.

Despite the efforts of previous designers, electrical connectors for PGA packages still pose important problems. For example, when an eccentric cam member is employed, it is typically inserted from an upper surface of the cover toward a lower surface of the base housing. Therefore, the eccentric cam must be secured after this insertion. Moreover, it is conventionally necessary to initialize the axial positioning of the inserted eccentric cam member with a high degree of precision in order for the rotation of the eccentric cam member to slide the cover through a desired range of motion relative to the base housing.

Another problem with electrical connectors for PGA packages is a lifting up of the cover during operation of an eccentric cam member. That is, when the cover is reciprocatingly moved by the rotation of the eccentric cam member, the cover often has a tendency to move up and away from the base housing.

A third problem with conventional electrical connectors may be designated "clattering". The user experiences this clattering as a stickiness or roughness in the rotation of the eccentric cam member. Clattering may be caused by assembly errors, poor manufacturing tolerances, or other factors. Ultimately, the clattering can shift the cover out of its intended operating position to the extent that the lead pins of the package can not be inserted into the electrical connector with zero insertion force.

An additional problem with conventional electrical connectors is overtravel of the of the cover relative to the base housing. Overtravel means that the cover is moved past the first insertion position or, in the opposite direction, past the second engagement position. Overtravel can make the insertion or removal of the pin terminals of the pin grid array difficult. In extreme cases of overtravel, the pin terminals or the electrical connector may be damaged. Lateral movement of the cover relative to the base housing is a related problem with similar consequences.

SUMMARY OF THE INVENTION

The invention is an improved zero insertion force electrical connector for a pin grid array having an overtravel preventor which limits movement of the cover relative to the base housing. The overtravel preventor includes a recessed portion and a protruded portion, which is movably accommodated within the recessed portion over a range of motion having a first insertion position and a second engagement position as end points. The invention may also include a guide mechanism for limiting lateral movement between the cover and the base housing.

In a preferred aspect, the invention is a zero insertion force electrical connector for mounting on a circuit member and receiving a device having a pin terminal array. The electrical connector includes a base housing defining an axle hole and having a plurality of individual terminal receiving cavities arranged in a terminal-receiving cavity array generally corresponding to the pin terminal array. A plurality of conductive terminals are distributed throughout the cavities. Each of the terminals has a contact area configured for engaging a portion of a respective one of the pin terminals.

A generally planar cover is mounted on the base housing. The cover defines a cam follower surface and is movable relative to the base housing between a first insertion position and a second engagement position. The cover also defines an array of through holes generally corresponding to the pin terminal array for receiving the pin terminals in the through holes. An actuator is mated with the cover and with the base housing. The actuator includes an eccentric cam member having an axis of rotation which is generally transverse to the plane of the cover. Rotation of the eccentric cam member causes the cover to move relative to the base housing between the first insertion position and the second engagement position.

The invention also includes an overtravel preventor to prevent the actuator from moving the cover past the first insertion position or the second engagement position. The overtravel preventor includes two side walls and a recessed portion defined by one of the cover and the base housing, and a protruded portion formed by the other of the cover and the base housing. The protruded portion is movably accommodated within the recessed portion over a range of motion having at least two end points which correspond to the first insertion position and the second engagement position, respectively.

In another preferred aspect, the invention is a zero insertion force electrical connector which includes a base housing, conductive terminals and a cover mounted on the base housing upper surface, substantially as described above. The cover also includes a metal upper cam plate, an insulative molded plate and a metal stiffener. The metal upper cam plate is adjacent one end of the cover, and has an upper follower surface which defines an upper cam hole. An actuator having a n eccentric cam member which includes a rotary axle configured to engage the axle hole, and an upper cam surface configured to engage the upper follower surface. The actuator serves to slide the cover relative to the base housing between the first insertion position and the second engagement position is mated with the cover and the base housing. The molded plate defines an array of through holes generally corresponding to the pin terminal array for receiving the pin terminals in the through holes.

Overtravel protection is provided by an overtravel preventor including two side walls and a recessed portion defined by one of the cover and the base housing, and a protruded portion formed by the other of the cover and the base housing. The protruded portion is movably accommodated within the recessed portion over a moveable range of motion having at least two end points which correspond to the first insertion position and the second engagement position, respectively.

In yet another preferred aspect, the invention is substantially as described above, with the additional features of the metal upper cam plate having an upper follower surface which defines an upper cam hole, and the metal stiffener having a lower follower surface which defines a lower cam hole. Also, the metal upper cam plate has an upper follower surface which defines an upper cam hole, and the metal stiffener has a lower follower surface which defines a lower cam hole. The cam surface has an upper portion and a lower portion. The rotary axle is attached to a retaining member and includes positioning means for positioning the retaining member relative to the rotary axle. At least one of the cam surface upper portion, the cam surface lower portion and the metal upper cam plate includes engagement means for limiting movement of the cover perpendicularly away from the base housing upper surface which permit the actuator to rotate about the rotary axle and the cover to move between the first insertion position and the second engagement position.

In still another preferred aspect, the invention is an electrical connector substantially as described above, which also includes a guide mechanism with a grooved portion defined by one of the cover and the base housing, and a tongue portion formed by the other of the cover and the base housing. The tongue portion is movably accommodated throughout a predetermined range of lateral travel within the grooved portion.

BRIEF DESCRIPTION OF THE DRAWINGS

Other objects and advantages of the present invention will be understood from the following description of an electrical connector according to one preferred embodiment of the present invention, which is shown in accompanying drawings.

DETAILED DESCRIPTION OF A PREFERRED EMBODIMENT

Figure 1:
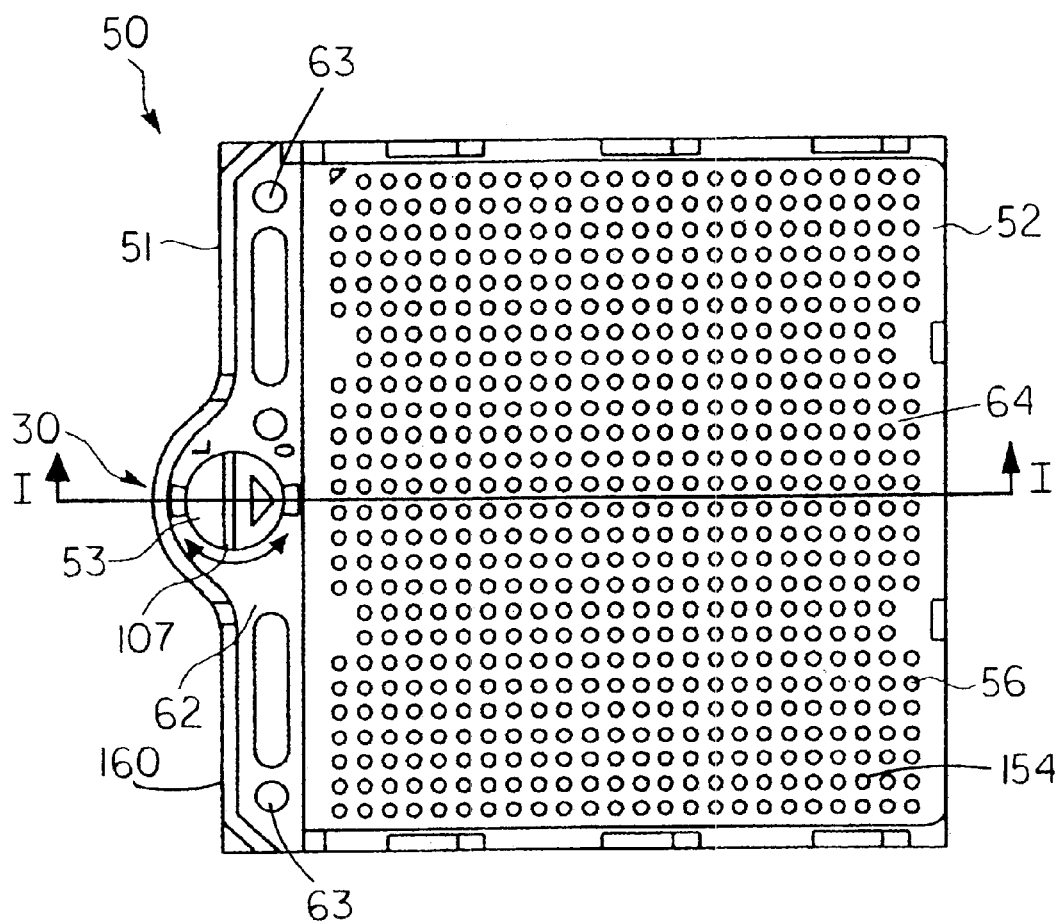
FIG. 1 is a plan view of an electrical connector for a zero insertion force pin grid array package according to the present invention.
Figure 2:
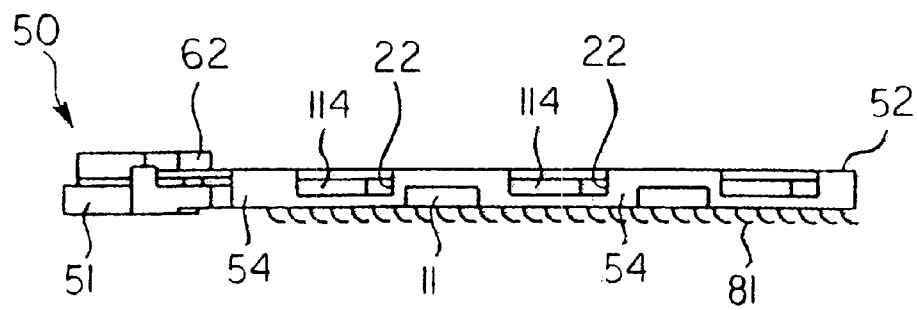
FIG. 2 is an elevation view of the electrical connector depicted in FIG. 1.
Figure 3:
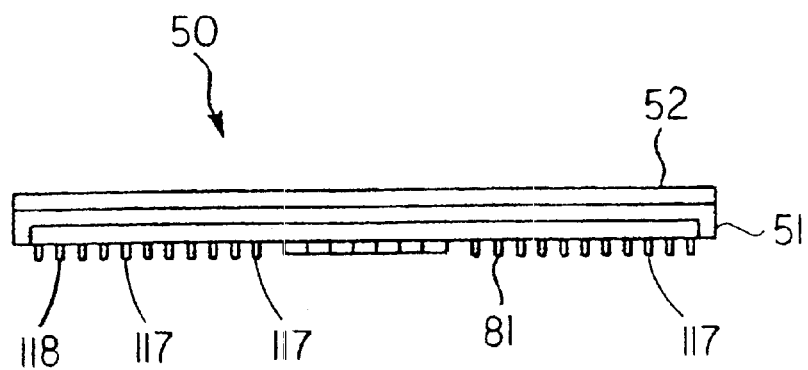
FIG. 3 is an elevation view of a previously known pin grid array package of the which may be accommodate by the electrical connector depicted in FIG. 1.
Figure 4:
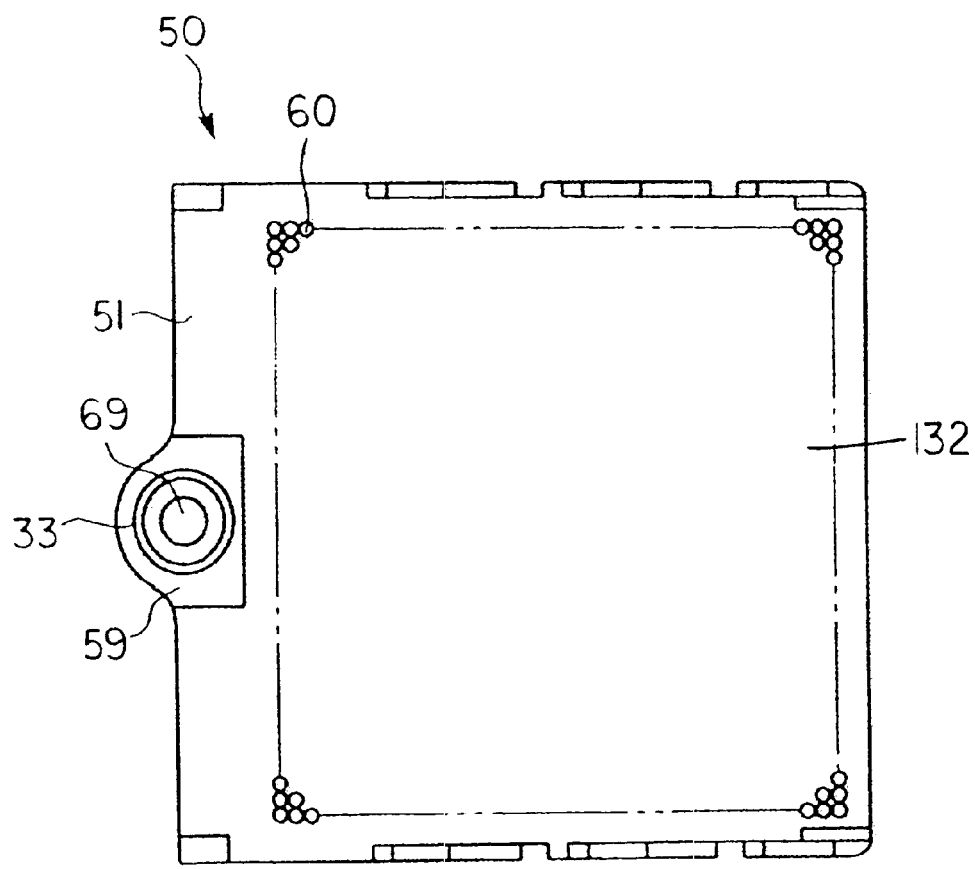
FIG. 4 is a view as seen from below of the electrical connector depicted in FIG. 1.
Figure 5:
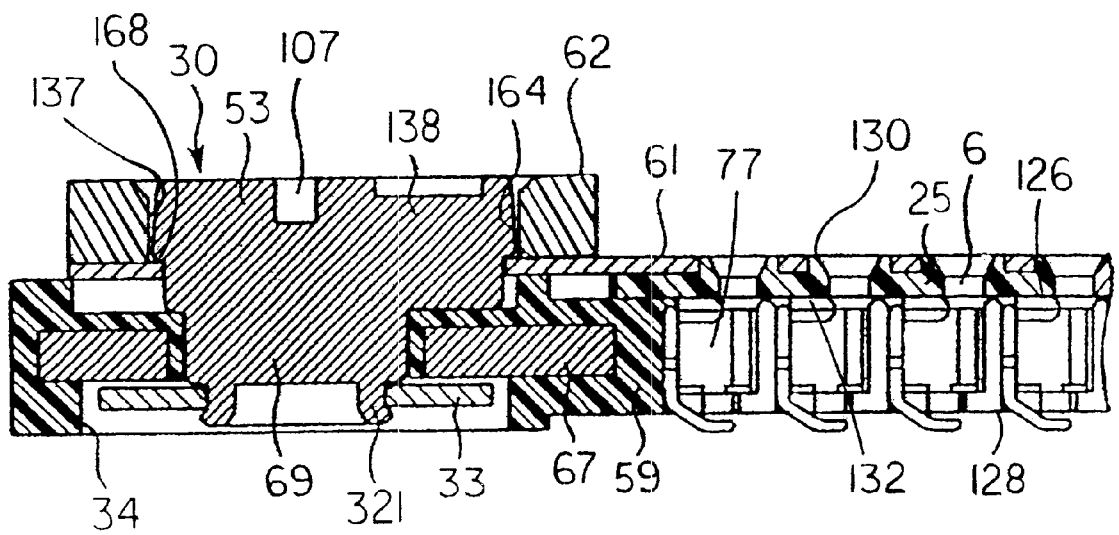
FIG. 5 is a partial cross-sectional view taken along section line I—I of the electrical connector depicted in FIG. 1.
Figure 6:
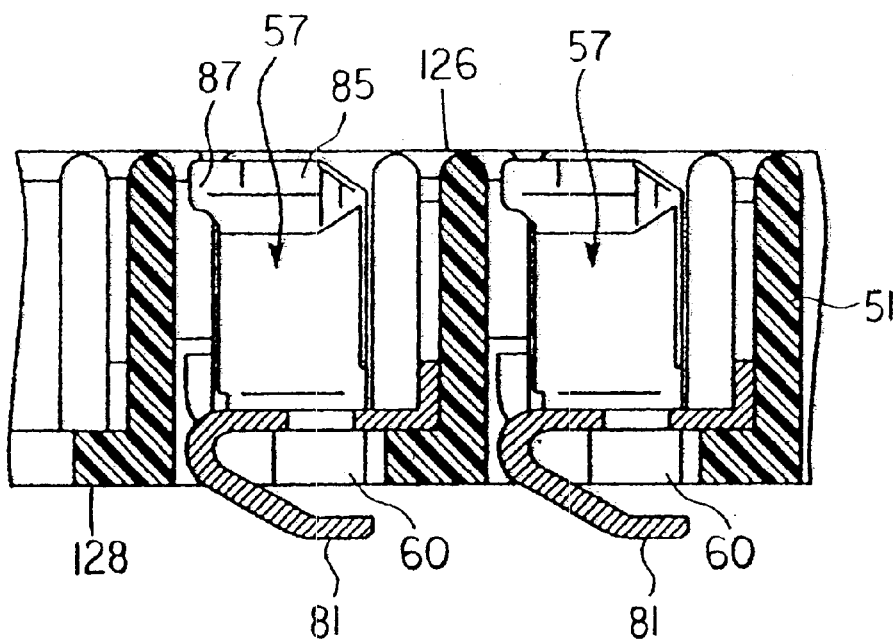
FIG. 6 is another partial cross-sectional view taken along section line I—I of the electrical connector depicted in FIG. 1.
Figure 7:
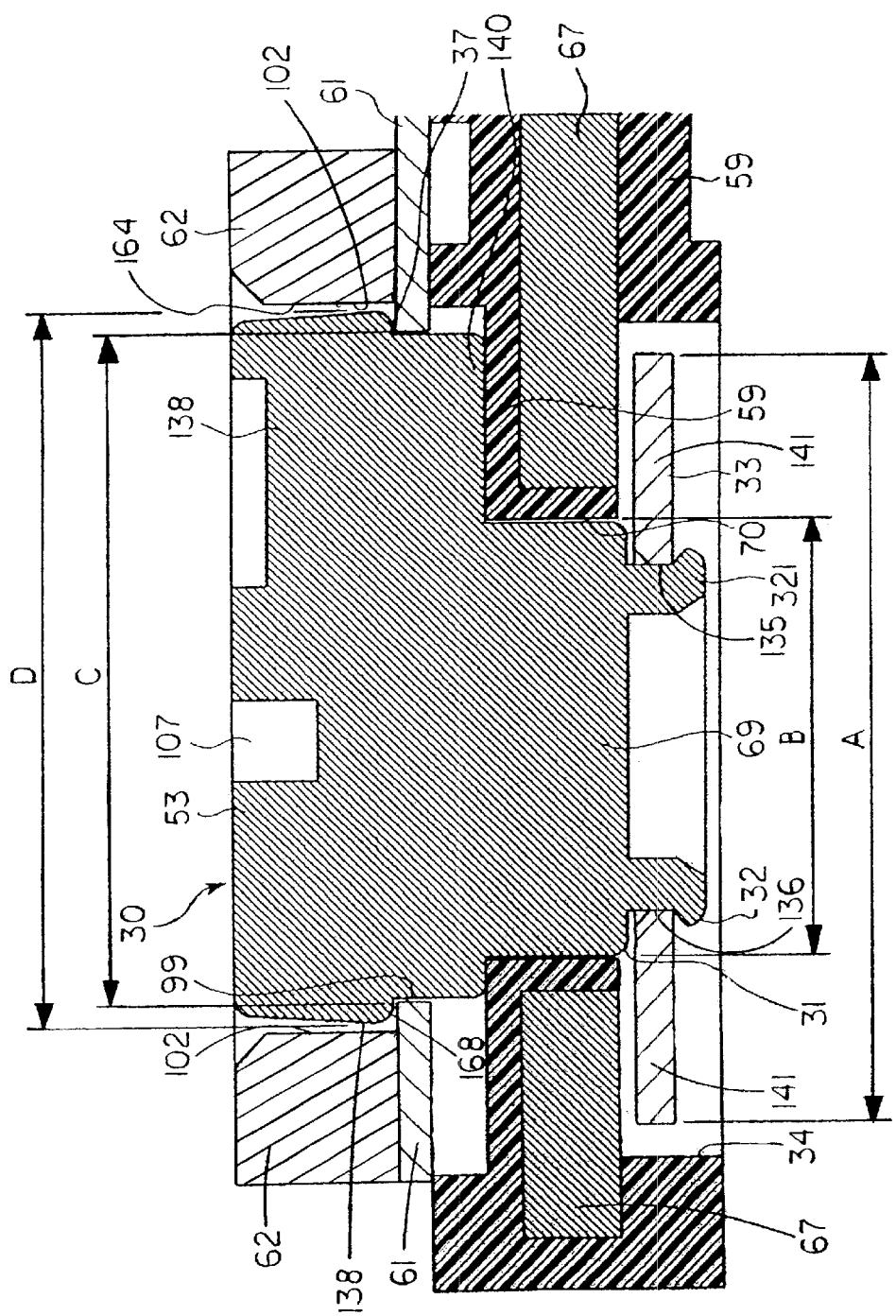
FIG. 7 is yet another partial cross-sectional view taken along section line I—I of the electrical connector depicted in FIG. 1.
Figure 8:
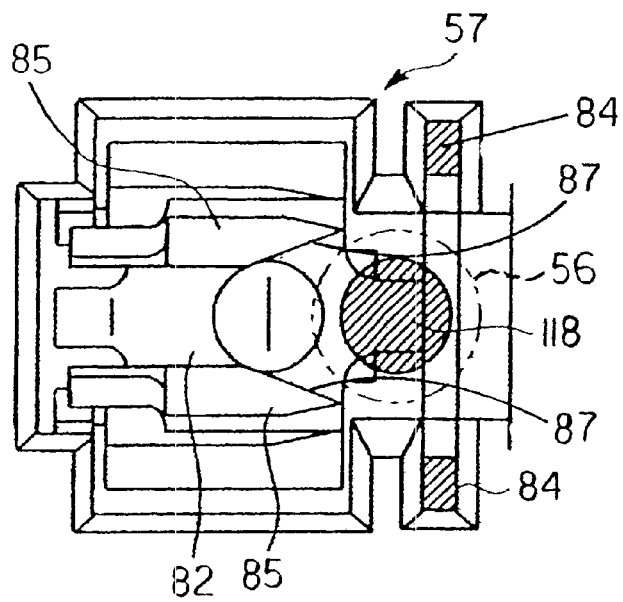
FIG. 8 is a plan view of a terminal which may be utilized in the invention, this view depicting a pin terminal of a pin grid array package as it would appear when in the first insertion position.
Figure 9:
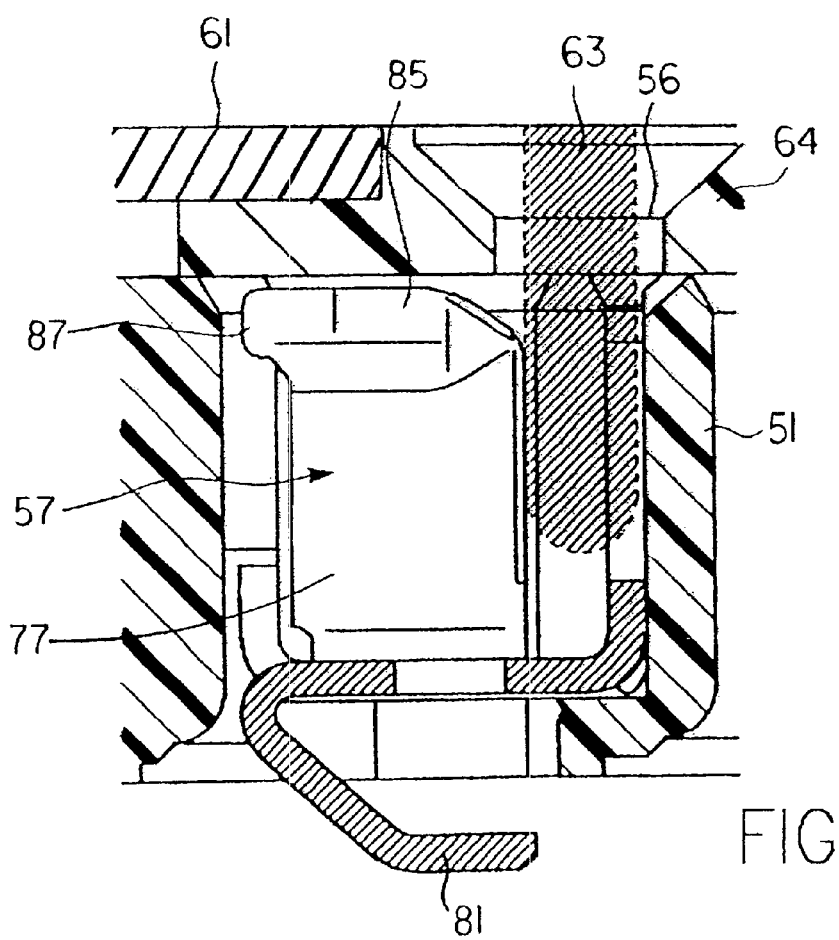
FIG. 9 is still another partial cross-sectional view taken along section line I—I of the electrical connector depicted in FIG. 1; this view depicting a pin terminal of a pin grid array package as it would appear when in the first insertion position.
Figure 10:
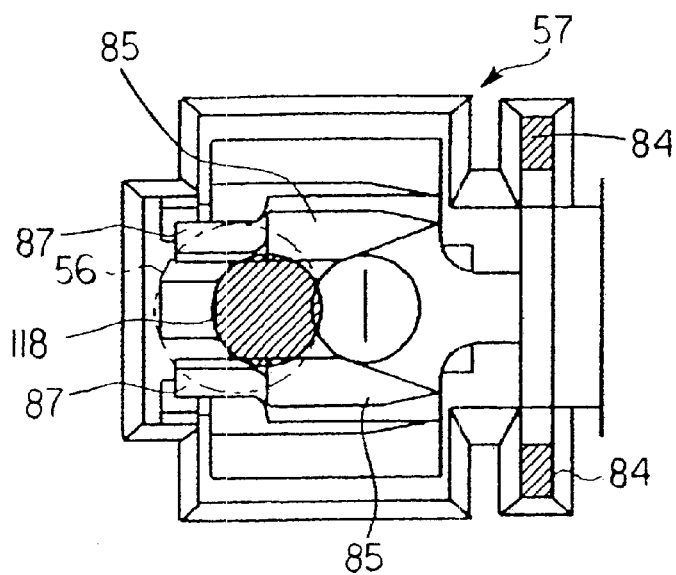
FIG. 10 is another plan view of a terminal which may be utilized in the invention, this view depicting a pin terminal of a pin grid array package as it would appear when electrically engaged with the terminal.
Figure 11:
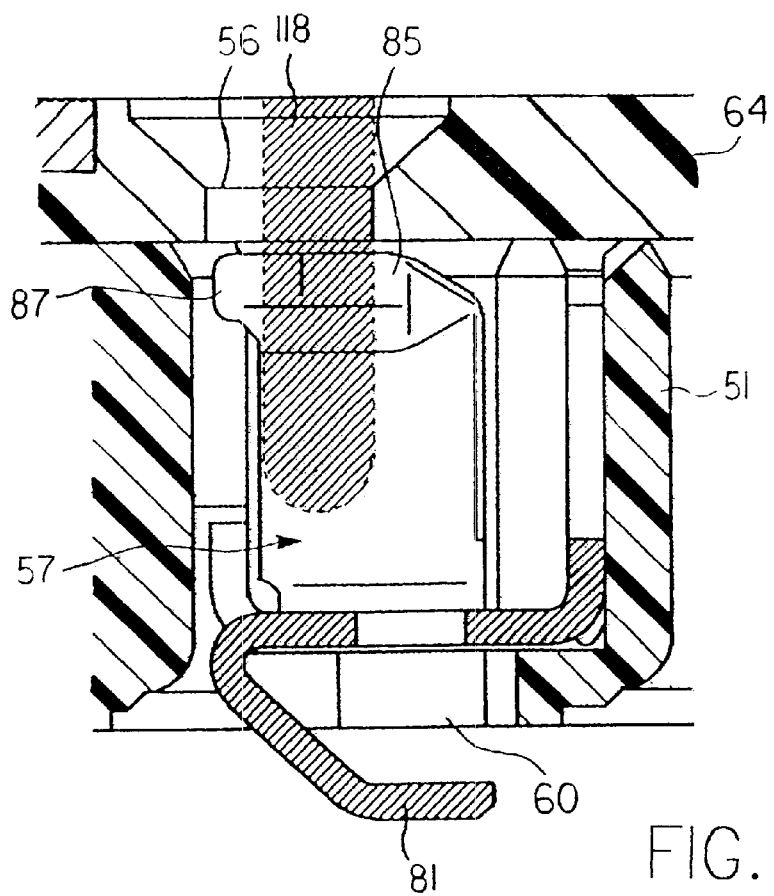
FIG. 11 is an additional partial cross-sectional view taken along section line I—I of the electrical connector depicted in FIG. 1, this view depicting a pin terminal of a pin grid array package as it would appear when electrically engaged with the terminal.

Referring now to FIG. 1, an electrical connector 50 for a pin grid array package comprises a plate-like base housing 51 and an overlying plate-like slide member or cover 52. Drive means 30 slidably moves the plate-like cover 52 in a plane parallel to the plane of the underlying plate-like base housing 51. For convenience in describing the electrical connector 50, the direction from the cover 52 to the base housing 51 will be referred to as "up" or upper", while the opposite direction will be referred to as "down" or "lower". However, the electrical connector 50 may be mounted or operated in any orientation with respect to the vertical.

The base housing 51 and cover 52 have semicircular extensions formed on respective lateral sides or ends thereof with holes therein for receiving an eccentric cam member or actuator 53 to provide drive means 30 for driving the cover 52 linearly along base housing 51. The eccentric cam member 53 is substantially as tall as the total thickness of the base housing 51 and cover 52, so that the upper and lower surfaces of the cam 53 are about flush with the upper surface of the cover 52 and the lower surface of the base housing 51, respectively. The cover 52 has D-shaped guide engagement pieces 54 integrally formed on its opposite longitudinal sides for guiding the movement of cover 52.

As seen from the Figures, the cover 52 has a plurality of through holes 56 arranged in the same grid pattern as the lead pins 118 of the pin grid array package 117 which electrical connector 50 is designed to receive, thus permitting the lead pins 118 to be inserted in the through holes 56. The underlying base housing 51 has terminal-receiving cavities 60 provided in a one-to-one corresponding relationship with the through holes 56 of the overlying cover 52. Each terminal-receiving cavity 60 has a terminal 57 press-fit therein. As discussed in greater detail below, the terminals 57 are configured to engage the lead pins 118 of pin grid array package 117 when it is mounted on the electrical connector 50 and the cover 52 is in the contact engagement position.

The molded plates or insulative components 59 and 64 of base housing 51 and cover 52, respectively, are not separate components which are assembled with other components to form the base housing and cover. Instead, they are plastic components which are molded around metal components of the base housing and cover. The base housing 51 is a generally rectangular or square molded plate or base housing insulative component 59 of insulating plastic or resin material which may have a metal frame as its core. The square molded plate 59 has terminal-receiving holes or cavities 60 arranged in the form of a lattice. Each cavity has a terminal 57 press-fit therein from its bottom side.

Similarly, the slide cover 52 is a generally rectangular or square molded plate or cover insulative component 64 of insulating plastic or resin material having a square metal plate stiffener 61 embedded therein as its core. As described in greater detail below, the metal plate stiffener 61 has a metal upper cam plate 62 fixed to the top surface of the square metal stiffener 61 by metal pins 63 at one lateral side of the stiffener. The upper cam plate 62 is thicker than the metal plate stiffener 61. The metal plate stiffener 61 has apertures located in the lattice pattern of the pins of the PGA package, and the molded plate 64 has through holes 56 in registration with the apertures of the metal plate stiffener 61.

The lower cam plate 67 has an axle hole 70 therein for rotatably accommodating the rotary axle 69 of the eccentric cam member 53. The axle hole 70 is preferably elongated, most preferably elliptical, and has a elongated hole having its major axis generally transverse to the direction in which the cover 52 moves relative to the base housing 51 when the cover 52 slides between said first insertion position and said second engagement position.

Eccentric cam member 53 includes an end portion of rotary axle 69 which is provided with positioning means 136 for positioning retaining member 33 at a predetermined position on rotary axle 69. Retaining member 33 may be, for example, a washer, a nut, a rivet head, or a cotter pin. Retaining member 33 has a width or diameter A which is relatively greater than the width or diameter of axle hole 70. Accordingly, retaining member 33 is prevented or hindered from passing through axle hole 70. Retaining member 33, positioning means and axle hole 70 constitute retention means 170 for maintaining the spacing and alignment of eccentric cam member 53 with the base housing 51.

Positioning means 136 includes a first stopper 31 for restricting the movement of retaining member 33 up rotary axle 69 toward cover 52. A second stopper 32 restricts movement of retaining member 33 down rotary axle 69. Preferably, a recess 34 which houses retaining member 33 and positioning means 136 is provided in base housing lower surface 128.

First stopper 31 or second stopper 32 may be a protrusion extending radially outward from rotary axle 69 or, alternatively, may be a shoulder of a generally circumferential groove 135 provided along the outer periphery of the rotary axle 69. In a preferred embodiment, an end portion of the rotary shaft portion 32 has a relatively smaller diameter portion 321, first stopper 31 is formed by a step portion extending along rotary axle 69 to the small diameter portion 321, and the second stopper 32 is formed by a ring-like protrusion on rotary axle 69.

Molded plate 59 has terminal-receiving holes or cavities 60 arranged in a grid array. The terminal-receiving cavities 60 are generally rectangular in shape, with a rectangular portion extending through the total thickness of the molded plate 59. Also, the terminal receiving cavities 60 have semicircular voids of insertion sections 77 on opposite sides thereof and extending down from the top surface of molded plate 59 about one half of the thickness thereof while communicating with rectangular cavity 60. Semicircular void 77 is an insertion section that allows a selected lead pin 118 of a pin grid-array package 117 to be inserted without contacting a terminal 57 located in terminal-receiving cavity 60. Thus, substantially no insertion force is required.

A conductive terminal 57 is mounted within each terminal-receiving cavity 60 by inserting it into the base housing 51. Each terminal 57 is stamped and formed of sheet metal material and includes a generally U-shaped section formed of a base 82 and a pair of contact arms 85 integrally connected to and extending up from the base 82. The contact arms 85 are angled toward each other so that they are spaced further apart adjacent base 82 than at their distal free end. At the distal end of each contact arm is an inwardly bulged contact area or section 87 which is formed to create a high pressure contact area which engages a pin 118 of a PGA package 117. The contact area 87 tapers away from the terminal retention section 84 as indicated at FIG. 16 in order to create a tapering region to receive the pin 118 of a PGA package 117.

Each terminal also includes a solder tail 81 that extends from one lateral side of base 82. The solder tail 81 extends initially away from base 82 and then curves downward until it angles downward relative to the lower surface of the base housing 51 in a generally linear manner to provide an appropriate tail for surface mount soldering on the surface of a printed circuit board. An end portion of the solder tail may extend upwards a short distance in order to form a generally circular surface mount contact section 86. Upon mounting the electrical connector 50 on a printed circuit board, the surface mount contact section 86 may be surface mount soldered to conductive pads on the printed circuit board in a known manner.

The terminal retention section 84 extends generally upward from the base 82 generally in parallel with the contact arms 85 of the terminal. Each of the contact arms 85 is approximately as tall as the thickness of the base housing assembly and the terminal retention section 84 is as tall as approximately one-half the thickness of the base housing. As a result, the terminal retention section 84 does not enter the pin-receiving cavity within the base mold.

A lower cam hole 99 is formed at approximately the center of one end of metal stiffener 61. Preferably, the lower cam hole 99 is generally cylindrical in shape and generally circular in cross-section. The interior surface of lower cam hole 99 accommodates snugly the rotary axle 69 of the eccentric cam member 53 to function as a lower follower surface.

The upper cam plate 62 has an upper cam hole 102 formed approximately adjacent its center and generally aligned with cover hole 99 of metal plate stiffener 61. Preferably, the lower cam hole 99 is generally cylindrical in shape and generally circular in cross-section. The interior surface of upper cam hole 102 accommodates snugly the cam surface upper portion 138 of the eccentric cam member 53 to function as an upper follower surface 164.

Prior to the plastic of cover 52 being molded, the metal plate stiffener 61 and upper cam plate 62 may be secured together in a spaced apart relationship by inserting metal pins 63 into holes of the metal plate stiffener 61 and upper cam plate 62, respectively. Portions of the metal plate stiffener 61 and upper cam plate 62 are embedded in molded plate 64 to form cover 52.

The cover 52 also includes a plurality of through holes 56 formed in the molded plate 64 in registration with the apertures 65 of the metal stiffener 61. Each through hole 56 includes a first section with straight sidewalls and a second section which is upwardly divergent in shape. The divergent section facilitates the guiding of the lead pin 118 of a pin grid array package 117 into electrical connector 50.

The engagement pieces 54 depend from opposite longitudinal sides of the overlying cover 52. Engagement projections 114 of the underlying base housing 51 extend into window-shaped openings in the engagement pieces 54. For example, three engagement pieces 54 may be generally evenly spaced along each longitudinal side of cover 52.

The eccentric cam member 53 is fitted in the electrical connector 50 by inserting the rotary axle 69 of the cam member 53 in the axle hole 70 of the base housing 51 after passing through holes 99 and 102 of the cover 52.

The eccentric cam member 53 is located in upper cam hole 102 of upper cam plate 62 with cam surface upper portion 138 confronting upper follower surface 164. The top of the eccentric cam member 53 is generally flush with upper surface of the upper cam plate 62, and the lower surface of the rotary axle 69 is generally flush with the base housing lower surface 128. Cam surface lower portion 140 is located in lower cam hole 99 with cam surface lower portion 140 confronting lower 166.

Cam surface lower portion 140 has a relatively smaller width or diameter as compared to the width or diameter D of cam surface upper portion 138. Also, the width or diameter C of lower cam hole 99, which is defined by metal stiffener 61, is relatively smaller as compared to the width or diameter D of cam surface upper portion 138. Accordingly, a step portion 37 is formed at the boundary between the cam surface upper portion 138 and cam surface lower portion 140 which is prevented or hindered from passing through lower cam hole 99. The cam surface lower portion 140 and lower cam hole 99 constitute engagement means 168 which permit rotation of eccentric cam member 53 while preventing relative movement of cover 52 up and away from base housing 51.

Since the metal plate 24 of the slide cover 20 is required to have the small diameter cam hole 27 into which the small diameter cam portion 37 is fitted in the above-mentioned fashion, in the illustrated example, the metal plate 24 is formed in size to extend over the entire lower surface of the cam receiving member 36. Of course, from the viewpoint of preventing the elevation of the slide cover 20, the small diameter cam hole 27 may be replaced with an engagement piece provided on the metal plate 24, for engagement with the step portion 37a. However, the provision of the small diameter cam hole 27 is preferable from the viewpoints of preventing clattering of the slide cover 20, the workability, and others.

Rotation of the eccentric cam member 53 may be effected, for example, by fitting a screwdriver in slot 107 and by rotating the tool. As rotary axle 69 rotates in the axle bearing hole 70, the eccentric cam member 53 engages the upper follower surface 164 of upper cam hole 102, which causes cover 52 to slide linearly relative to base housing 51. Rotating the cam member 53 over 90 degrees aligns the cover 52 at a predetermined position.

In the pin insertion position, each through hole 56 of the cover 52 is aligned with a selected semicircular void or insertion section 77, which is adjacent to the opposed contact arms 85 of the terminals 57 in the terminal-receiving cavities 60. In such configuration, each lead pin 118 of a pin grid-array package 117 can be inserted into electrical connector 50 with essentially no insertion force being applied to the lead pins 118.

After insertion of the lead pins 118, the eccentric cam member 53 is rotated counterclockwise, preferably another 90 degrees. This additional 90 degrees of rotation causes the cover 52 and the pin grid array package 117 mounted thereon to slide to the contact engaging position so that the pins 118 of the pin grid array package 117 engage respective ones of terminals 57.

In the assembled electrical connector 50, the eccentric cam member 53 can rotate from the forceless-insertion position in which the pins 118 of the PGA package 117 engage terminals 57. The angular range between these positions is preferably about 180 degrees or less, more preferably about 90 degrees.

When the cover 52 is in its contact engaging position, each and every through hole 56 of cover 52 is positioned immediately above the contact arms 85 of terminals 57 in the terminal-receiving cavities of the base housing 51. The sliding of the cover 52 bearing the pin grid-array package 117 from the insertion position to the contact engaging position brings the lead pins 118, which are inserted in the through holes 56 of the cover 52, between the contact arms 85 of a selected terminal 57, thus completing connection of the pin grid-array package 117 to the electrical connector 50.

When each lead pin engages the opposed contact arms 85 of a selected terminal, it is driven into the space defined by the raised contact surfaces 87 of the opposite contact arms 85 while being guided smoothly into position by tapering region which is divergent toward the semicircular void 77. The space between raised contact areas 87 is dimensioned so that a lead pin is engaged with a contact pressure strong enough to assure that stable and reliable electric contact is established.

Figure 12:
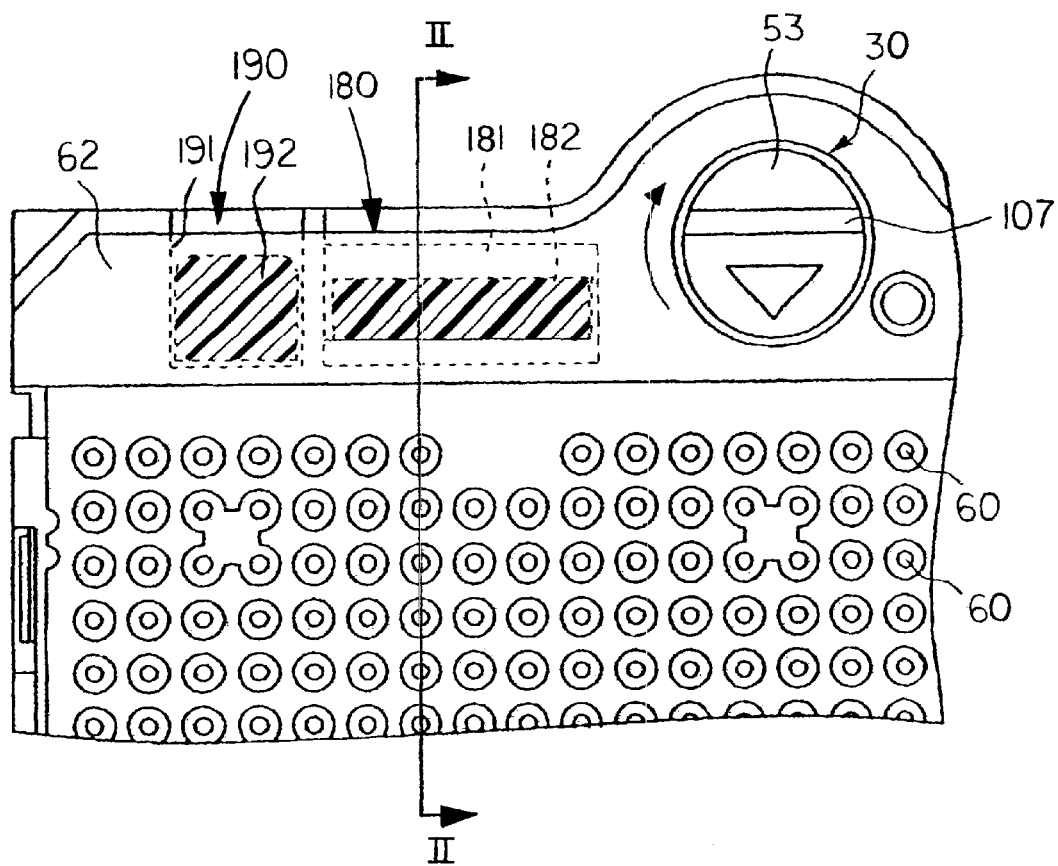
FIG. 12 is a partial plan view of the of the electrical connector depicted in FIG. 1.
Figure 13:
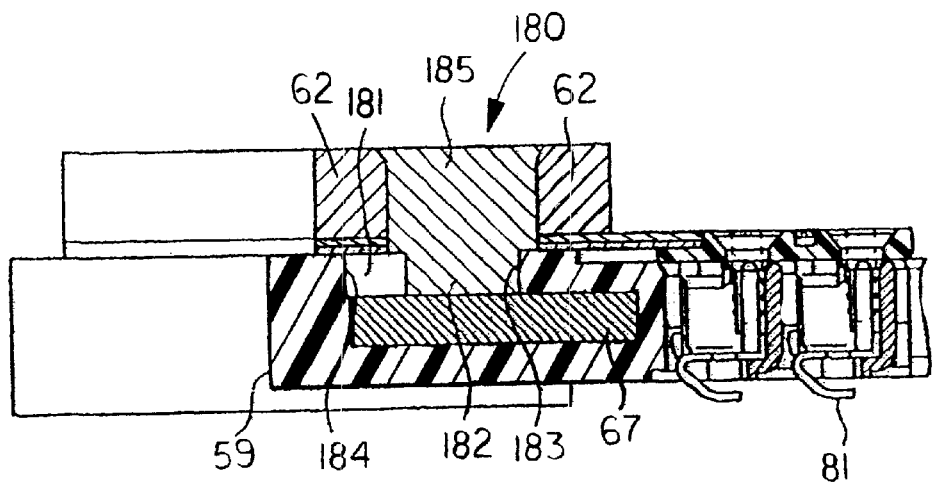
FIG. 13 is a partial cross-sectional view taken along section line II—II in FIG. 12, this view depicting an overtravel preventor as it would appear when at the limit of its range of movement corresponding to the first insertion position.
Figure 14:
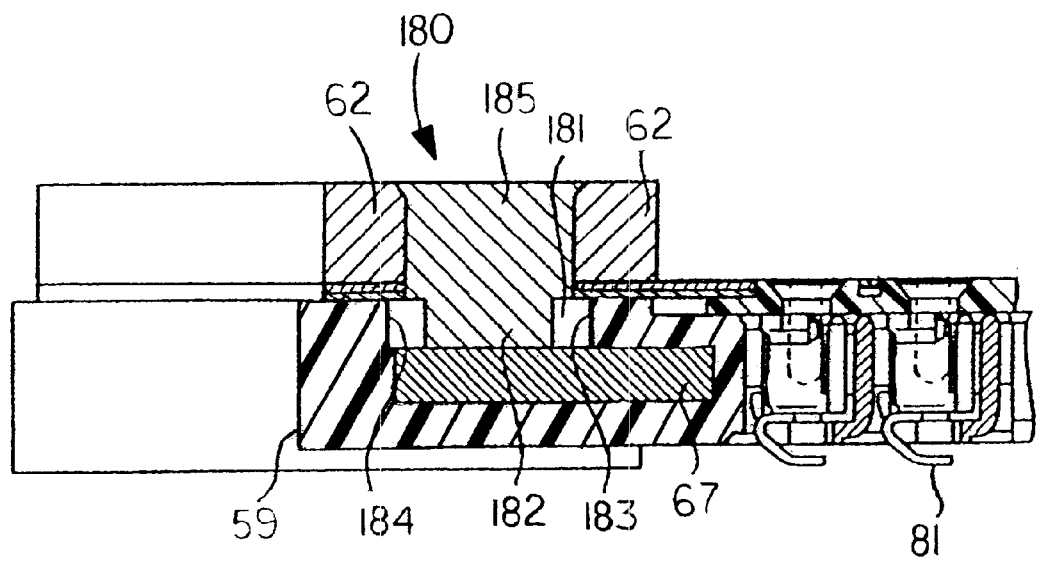
FIG. 14 is a partial cross-sectional view taken along section line II—II in FIG. 12, this view depicting an overtravel preventor as it would appear when at an intermediate position within its range of movement.
Figure 15:
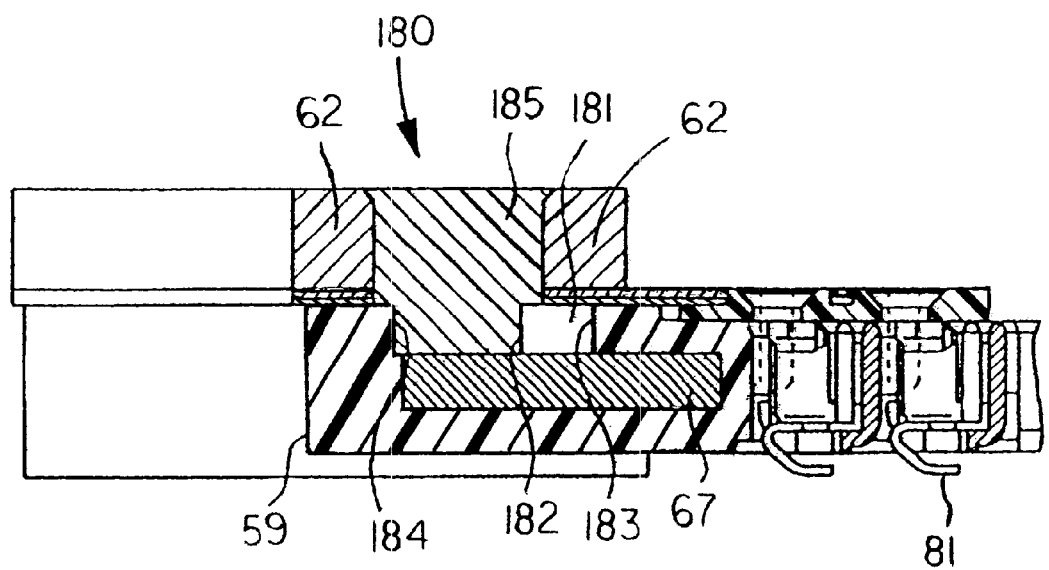
FIG. 15 is a partial cross-sectional view taken along section line II—II in FIG. 12, this view depicting an overtravel preventor as it would appear when at the limit of its range of movement corresponding to the second engagement position.

FIG. 12 is a plan view a plan view and FIGS. 13 through 15 are partial sectional views taken along section line II—II in FIG. 12. Referring now to FIG. 12, overtravel preventor 180 serves to regulate the sliding range of the cover 52 as well as to position the cover 52 at one or more predetermined positions. For example, overtravel preventor 180 may regulate cover 52 to be reciprocatingly moved only between a first insertion position in which pin terminal 118 of pin grid array 117 can be passed through through-hole 56 and inserted into semicircular void or insertion section 77 of base housing 51, and a second engagement position in which pin terminal 118 of is electrically contacted with terminal 57.

The overtravel preventor 180 includes a recessed portion 181 and a protruded portion 182. Recessed portion 181 is defined by either base housing 51 or cover 52, preferably in the shape of an elongated rectangle when seen in plan view. Protruded portion 182 is formed by cover 52 when recessed portion 181 is defined by base housing 51 or, alternatively, formed by base housing 51 when recessed portion 181 is defined by cover 52. Protruded portion 182 is preferably generally in the same shape as cover 52 when seen in plan view, and relatively smaller as compared to at least one dimension of recessed portion 181, so that protruded portion 182 is movably accommodated throughout a predetermined range of travel within recessed portion 181.

The movable range of travel preferably corresponds to the distance between the first insertion position and the second engagement position, and the directions of permitted movement within the movable range preferably correspond to the directions of movement between the first insertion position and the second engagement position. Consequently, even if the fit between cover 52 and base housing 51 is less than ideal due to manufacturing dimensional error or the like, cover 52 can be accurately positioned at the first insertion position or the second engagement position by sliding cover 52 to one or the other limits of the movable range. Accordingly, the mounting precision is effectively enhanced.

The recessed portion 181 may be disposed on the surface of the base housing 51 in the vicinity of one longitudinal end of base housing 51. The bottom surface of recessed portion 181 is preferably formed by lower cam plate 67, and both side wall surface 183 and side wall surface 184 of recessed portion 181 are conveniently formed by molded plate 59. It is especially preferred that a base portion 185 of protruded portion 182 is attached to upper cam plate 62.

The movable range of cover 52 between the first insertion position and the second engagement position preferably corresponds to a rotation of 180 degrees by eccentric cam member 53. When cover 52 approaches either the first insertion position or the second engagement position, protruded portion 182 contacts side wall surface 183 or side wall surface 184 of recessed portion 181 to cause resistance against further movement by the cover 52 and, consequently, against further rotation of eccentric cam member 53.

The magnitude of the resistance should small enough so that eccentric cam member 53 can be further rotated without damage, but large enough so that the resistance provides a clear signal to a human operator or to an automated assembly machine that a limit to the movable range has been reached. One method of arranging the proper magnitude of resistance is to construct recessed portion 181, protruded portion 182 or both from an elastically deformable material.

In the preferred embodiment depicted in FIG. 12, overtravel preventor 180 is located relatively close to drive means 30. However, overtravel preventor 180 may be located at any position between cover 52 and base housing 51. For example, overtravel preventor 180 may be located on a side surface of electrical connector 50. Further, the permissible shapes of recessed portion 181 and the protruded portion 182 of the overtravel preventor 180 are not limited to the shapes illustrated in the Fig.s. Additionally, one overtravel preventor, a pair of overtravel preventors or a multitude of overtravel preventors may be provided as desired.

In FIG. 12, reference numeral 190 designates a guide mechanism. Guide mechanism 190 is provided to guide the lateral motion of cover 52 as it slides longitudinally between the first insertion position and the second engagement position. This additional guidance prevents clattering of cover 52 in the lateral direction, and generally serves to make the cover slide more smoothly and reliably.

Guide mechanism 190 includes a grooved portion 191 and a tongue portion 192. Grooved portion 191 is defined by either base housing 51 or cover 52, preferably in the shape of an elongated rectangle when seen in plan view. Tongue portion 192 is formed by cover 52 when grooved portion 191 is defined by base housing 51 or, alternatively, formed by base housing 51 when grooved portion 191 is defined by cover 52. Tongue portion 192 is generally in the same shape as cover 52 when seen in plan view, and relatively smaller as compared to at least one dimension of grooved portion 191, so that the tongue portion 192 is movably accommodated throughout a predetermined range of lateral travel within grooved portion 191.

Although the present invention has been illustrated and described with respect to exemplary embodiment thereof, it should be understood by those skilled in the art that the various changes, omissions and additions may be made therein and thereto without departing from the spirit and scope of the present invention as set forth in the appended claims.

What is claimed is:

1. A zero insertion force electrical connector for mounting on a circuit member and receiving a device having a pin terminal array, said electrical connector comprising:

a base housing having a plurality of individual terminal receiving cavities arranged in a terminal receiving cavity array generally corresponding to the pin terminal array;

a generally planar cover mounted on said base housing and movable relative to the base housing between a first insertion position and a second engagement position, said cover defining an array of through holes generally corresponding to the pin terminal array for receiving said pin terminals in said through holes;

a plurality of conductive terminals, at least one of said terminals being mounted in one of said cavities, each said terminal including a contact area configured for engaging a portion of a respective one of said pin terminals;

an actuator which includes an eccentric cam member having an axis of rotation which is generally transverse to the plane of the cover, the eccentric cam member mating with the cover and with the base housing so that rotation of the eccentric cam member causes the cover to move relative to the base housing between the first insertion position and the second engagement position; and an overtravel preventor including two side walls and a recessed portion defined by one of the cover and the base housing, and a protruded portion formed by the other of the cover and the base housing, the protruded portion being movably accommodated within the recessed portion over a range of motion having at least two end points which correspond to the first insertion position and the second engagement position, respectively.

2. The electrical connector of claim 1 in which the protruded portion, when the cover approaches the first insertion position, contacts one of the wall surfaces of the recessed portion to resist rotation of the eccentric cam member.

3. The electrical connector of claim 1 in which the protruded portion, when the cover approaches the second engagement position, contacts the other of the wall surfaces of the recessed portion to resist rotation of the eccentric cam member.

4. The electrical connector of claim 1 in which at least one of the protruded portion and the recessed portion is composed of an elastically deformable material which does not prevent rotation of the eccentric cam member.

5. The electrical connector of claim 1 in which the recessed portion is disposed on the base housing and adjacent to an end of the base housing.

6. The electrical connector of claim 1 in which one of the cover and the base housing includes a grooved portion, and the other of the cover and the base housing includes a tongue portion, and the tongue portion is movably accommodated throughout a predetermined range of lateral travel within the grooved portion, the lateral travel being generally transverse to the range of motion within the recessed portion.

7. A zero insertion force electrical connector for mounting on a circuit member and receiving a device having a pin terminal array, said electrical connector comprising:

a dielectric generally planar base housing, said base housing having an upper surface and a lower surface, an axle bearing hole and a plurality of individual terminal receiving cavities extending between said base housing upper surface and said base housing lower surface and arranged in a terminal-receiving cavity array generally corresponding to the pin terminal array;

a generally planar cover mounted on said base housing upper surface, said cover being movable relative to the base housing between a first insertion position and a second engagement position, said cover having an upper surface and a lower surface and including an insulative molded plate, a metal upper cam plate and a metal stiffener; said molded plate defining an array of through holes generally corresponding to the pin terminal array for receiving said pin terminals in said through holes, said metal upper cam plate being adjacent one end of said cover, said metal upper cam plate having an upper follower surface which defines an upper cam hole;

a plurality of conductive terminals, at least one of said terminals being mounted in one of said cavities, each said terminal including a contact area configured for engaging a portion of a respective one of said pin terminals; and an actuator including a rotary axle configured to engage the axle hole and an upper cam surface configured to engage the upper follower surface in order to slide the cover relative to the base housing between said first insertion position and said second engagement position; and an overtravel preventor including two side walls and a recessed portion defined by one of the cover and the base housing, and a protruded portion formed by the other of the cover and the base housing, the protruded portion being movably accommodated within the recessed portion over a range of motion having at least two end points which correspond to the first insertion position and the second engagement position, respectively.

8. The electrical connector of claim 7 in which the recessed portion the side walls of the recessed portion are formed by the molded plate, and the lower cam plate is disposed adjacent the recessed portion.

9. The electrical connector of claim 7 in which the protruded portion includes a base portion which is attached to the upper cam plate.

10. The electrical connector of claim 7 in which the protruded portion, when the cover approaches the first insertion position, contacts one of the wall surfaces of the recessed portion to resist rotation of the eccentric cam member.

11. The electrical connector of claim 7 in which the protruded portion, when the cover approaches the second engagement position, contacts the other of the wall surfaces of the recessed portion and resists rotation of the eccentric cam member.

12. The electrical connector of claim 7 in which the at least one of the protruded portion and the recessed portion is composed of an elastically deformable material which does not prevent rotation of the eccentric cam member.

13. The electrical connector of claim 7 in which the recessed portion is disposed on the base housing and adjacent to an end of the base housing.

14. The electrical connector of claim 7 in which one of the cover and the base housing includes a grooved portion, and the other of the cover and the base housing includes a tongue portion, and the tongue portion is movably accommodated throughout a predetermined range of lateral travel within the grooved portion, the lateral travel being generally transverse to the range of motion within the recessed portion.

15. A zero insertion force electrical connector for mounting on a circuit member and receiving a device having a pin terminal array, said electrical connector comprising:

a dielectric generally planar base housing, said base housing having an upper surface and a lower surface, an axle bearing hole and a plurality of individual terminal receiving cavities extending between said base housing upper surface and said base housing lower surface and arranged in a terminal-receiving cavity array generally corresponding to the pin terminal array;

a generally planar cover mounted on said base housing upper surface, said cover being movable relative to the base housing between a first insertion position and a second engagement position, said cover having an upper surface and a lower surface and including an insulative molded plate, a metal upper cam plate and a metal stiffener; said molded plate defining an array of through holes generally corresponding to the pin terminal array for receiving said pin terminals in said through holes, said metal upper cam plate being adjacent one end of said cover and spaced from said through holes, said metal upper cam plate having an upper follower surface which defines an upper cam hole, and said metal stiffener having a lower follower surface which defines a lower cam hole;

a plurality of conductive terminals, at least one of said terminals being mounted in one of said cavities, each said terminal including a contact area configured for engaging a portion of a respective one of said pin terminals;

an actuator including a rotary axle configured to engage the axle hole and a cam surface configured to engage the upper follower surface in order to slide the cover relative to the base housing between said first insertion position and said second engagement position, the cam surface having an upper portion and a lower portion, the rotary axle attached to a retaining member and including positioning means for positioning the retaining member relative to the rotary axle, and at least one of the cam surface upper portion, the cam surface lower portion and the metal upper cam plate including engagement means for limiting movement of the cover perpendicularly away from the base housing upper surface which permit the actuator to rotate about the rotary axle and the cover to move between said first insertion position and said second engagement position; and an overtravel preventor including two side walls formed by the molded plate, and a recessed portion defined by the side walls and the lower cam plate, and a protruded portion which is formed by the cover and movably accommodated within the recessed portion over a range of motion having at least two end points which correspond to the first insertion position and the second engagement position, respectively; the protruded portion including a base portion which is attached to the upper cam plate.

16. The electrical connector of claim 15 in which the protruded portion, when the cover approaches the first insertion position, contacts one of the wall surfaces of the recessed portion so as to resist rotation of the eccentric cam member.

17. The electrical connector of claim 15 in which the protruded portion, when the cover approaches the second engagement position, contacts the other of the wall surfaces of the recessed portion and resists rotation of the eccentric cam member.

18. The electrical connector of claim 15 in which the at least one of the protruded portion and the recessed portion is composed of an elastically deformable which does not prevent rotation of the eccentric cam member.

19. The electrical connector of claim 15 in which the recessed portion is disposed on the base housing and adjacent to an end of the base housing.

20. A zero insertion force electrical connector for mounting on a circuit member and receiving a device having a pin terminal array, said electrical connector comprising:

a base housing having a plurality of individual terminal-receiving cavities arranged in a terminal receiving cavity array generally corresponding to the pin terminal array;

a generally planar cover mounted on said base housing, said cover being movable relative to the base housing between a first insertion position and a second engagement position, and said cover defining an array of through holes generally corresponding to the pin terminal array for receiving said pin terminals in said through holes;

a plurality of conductive terminals, at least one of said terminals being mounted in one of said cavities, each said terminal including a contact area configured for engaging a portion of a respective one of said pin terminals;

an actuator which includes an eccentric cam member having an axis of rotation which is generally transverse to the plane of the cover, the eccentric cam member mating with the cover and with the base housing so that rotation of the eccentric cam member causes the cover to move relative to the base housing between the first insertion position and the second engagement position; and a guide mechanism including a grooved portion which is defined by one of the cover and the base housing, and a tongue portion which is formed by the other of the cover and the base housing, the tongue portion being movably accommodated throughout a predetermined range of lateral travel within the grooved portion, the lateral travel being generally transverse to the direction of cover movement relative to the base housing between the first insertion position and the second engagement position.

* * * * *